(12) United States Patent
Kress

(10) Patent No.: US 7,881,351 B2
(45) Date of Patent: Feb. 1, 2011

(54) LASER MODULE

(75) Inventor: Ekkehard Kress, Wasserburg (DE)

(73) Assignee: IIE GmbH & Co. KG, Soyen (DE)

( * ) Notice: Subject to any disclaimer, the term of this patent is extended or adjusted under 35 U.S.C. 154(b) by 0 days.

(21) Appl. No.: 12/602,263

(22) PCT Filed: May 30, 2008

(86) PCT No.: PCT/EP2008/056654

§ 371 (c)(1),
(2), (4) Date: Jan. 21, 2010

(87) PCT Pub. No.: WO2008/145713

PCT Pub. Date: Dec. 4, 2008

(65) Prior Publication Data

US 2010/0158058 A1    Jun. 24, 2010

(30) Foreign Application Priority Data

May 30, 2007    (EP) .................................. 07109247

(51) Int. Cl.
*H01S 3/04* (2006.01)
(52) U.S. Cl. .............................. 372/35; 372/34; 372/36
(58) Field of Classification Search .............. 372/34–36
See application file for complete search history.

(56) References Cited

U.S. PATENT DOCUMENTS

| 4,826,269 A * | 5/1989 | Streifer et al. ................. 359/19 |
| 5,471,491 A * | 11/1995 | Phillips et al. ................. 372/35 |
| 7,773,653 B2 * | 8/2010 | Voss et al. ............... 372/50.12 |
| 2005/0141574 A1 * | 6/2005 | Sakano et al. ................. 372/34 |
| 2007/0291803 A1 * | 12/2007 | Crum .......................... 372/34 |
| 2008/0025357 A1 * | 1/2008 | Coleman et al. .............. 372/36 |

* cited by examiner

*Primary Examiner*—Minsun Harvey
*Assistant Examiner*—Phillip Nguyen
(74) *Attorney, Agent, or Firm*—Karl F. Milde, Jr.; Eckert Seamans; Cherin & Mellot, LLC

(57) ABSTRACT

A laser module (1) with at least two laser units (3) are adjusted such that the emitted beams of the laser units (3) converge. The laser units (3) exhibit cooling channels (5) that are provided with a cooling medium. At least one of the laser units has a curved adjustment surface (10) which his mounted to a facing mounting surface (9) of a mounting unit (2) such that a cooling channel opening in the adjustment surface (9) is located opposite an additional cooling channel opening in the mounting surface (10).

12 Claims, 1 Drawing Sheet

LASER MODULE

BACKGROUND OF THE INVENTION

The invention relates to a laser module with at least two laser units.

Semiconductor diode lasers are the state-of-the-art in many areas of application. Compared to other laser types, they have the advantage that they can be manufactured using known semiconductor technologies, are easily integrated in electronic circuits, are small and have a great efficiency. Thus, their areas of use are varied and reach from telecommunications to use in optical data memories, printers and to metrology. In recent time, semiconductor lasers are also used in material processing.

In the end, all material processing methods using lasers such as drilling, cutting, welding, soldering or curing are based on the pinpoint accuracy of depositing energy. This leads to localized melting or even evaporating of the material. This requires considerable laser power, which in recent times can be provided by CO2 or Nd:YAG lasers. However, the output power of one single emitting laser diode is limited to a few 100 mW.

To increase the power of a laser unit, the light of several individual laser diodes is combined to one common beam. One option is to combine a certain number of laser diodes—typical is a number of 20 to about 80—with a cross section of about 1-3.5 mm in their pn-junction plane adjacent to each other into one group. Such a laser diode group provides a laser power of about 10-80 Watts. Using optical means, the laser beam can be given a point- or line-shaped cross-section.

To further increase the power, several of these laser diode groups are arranged above one another resulting in a laser bar with a length of up to 10 cm and a power of several 100 W. This laser bar generates a parallel light beam with a line-shaped cross-section whereby the width of the line corresponds approximately to the height of the laser bar. Shaping of the beam is achieved via collimator lenses. Typically, one laser bar is housed in a laser unit with the respective electrical connections. To generate high power in the kW-range, several of these laser units are combined to one laser module.

The emitted laser beam of a laser bar is shaped by an optical system in the laser unit such that the line width can be narrowed even further. The light beams emitted by the individual laser units are directed onto a work piece surface such that they are overlaying each other and form one line of high intensity.

However, problems occur when arranging many individual laser diodes next to and above each other. Although semiconductor laser diodes offer high efficiency, still, the largest portion of the electrically supplied energy in the laser diode is converted to heat. As a consequence, the laser diode bar heats up significantly and in order to avoid its destruction, it must be cooled intensively. For this purpose, heat sinks are provided that dissipate the heat loss of the laser diodes to a cooling medium. The laser units exhibit openings for supplying the cooling medium. If several units are operated and their laser light is oriented to one lens, the individual laser units must be adjustable. The supply of the cooling medium may interfere with such adjustments.

SUMMARY OF THE INVENTION

It is, therefore, the objective of the invention to design a laser module such that several laser units can be assembled and that an adjustment of the individual laser units is possible independent of the supply of the cooling medium. Furthermore, the laser units should be situated in as little space as possible.

According to the invention, a mounting unit with at least one mounting surface is provided. At this mounting surface, at least one laser unit with a curved adjustment area is fastened such that a cooling channel opening in the adjustment area is located opposite a another cooling channel opening in the mounting surface. The cooling medium that is required for cooling the laser diode bar is pumped through these cooling channel openings located opposite of each other. In this manner, hoses carrying the cooling medium can be avoided, although they would allow adjustments as well but would take up much space, require much effort to install and would quickly lead to leakage in particular at high temperatures. By using the mounting unit, individual laser units can be situated in a very space-saving manner. Thus, the mounting unit not only serves as a support for the laser units but at the same time as means for supplying the laser units with cooling medium. In an advantageous manner, an opening for supplying and an opening for removing the cooling medium are provided in the mounting unit and in each laser unit.

In a particularly advantageous manner, a ring seal is used to provide sealing between the cooling channel opening in the adjustment surface and the cooling channel opening in the mounting surface. This ring seal is placed into a groove located in the mounting surface. The ring seal is sufficiently large to enclose the cooling chamber openings located opposite each other in any possible adjustment position. A separate ring seal is provided for the inlet as well as the outlet opening for the cooling medium. The ring seal can be designed as a gland seal, for example. Because ring seals are generally manufactured according to customer-specific requirements, they are very expensive, in particular for low numbers.

An O-ring design is particularly advantageous for the ring seal. O-rings are excellently suited as a seal between two surfaces. O-rings are proven in this area of application. They are available in many different dimensions such that there is no need for procuring an expensive tool. Additionally, O-rings are available in various materials that can be optimized for the respective purpose of use. Thus, O-rings promise a long service life for the cooling medium in use and can be procured economically. The design of the groove where the O-rings are placed is round, typically with a rectangular cross-section, which requires little manufacturing technology.

To ensure the adjustability of the laser units, the connection must be tight even when the cross-sections of the cooling channel openings of the laser unit and of the mounting unit are not exactly opposite each other. Thus, the cooling chamber openings advantageously exhibit different cross-sections. The difference is sufficiently large that the cross-section of one cooling channel opening covers the cross-section of the other cooling channel opening across the entire adjustment range. In this manner, the cooling circuit will have no undesired constrictions relating to the adjustment, in particular in the transition areas between the laser unit and the mounting unit.

It is also possible to provide an incremental change of the cross-sections in the direction of flow. In this manner, the cooling channel that feeds the cooling medium in the mounting unit to the laser unit can have a smaller cross-section than the cooling channel in the laser unit itself. The cooling channel cross-section of the laser unit at the outlet to the mounting unit is, again, smaller than the cooling channel cross-section of the mounting unit itself. Thus, in the direction of the cooling medium flow, the cross-section increases at the transition to the respective subsequent unit. This increase in the cross-section prevents a pressure rise in the transition areas that would lead to an increased stress on the O-rings during operation and thus to a reduced durability.

The mounting surface can be flat. However, this would require for the O-rings to adapt to the curvature of the adjustment surface and thus being significantly raised in relation to the mounting surface. However, this would cause tightness and durability problems for the O-rings. Thus, the mounting surface exhibits the same curvature as the adjustment surface. In this manner, the required protrusion of the O-rings can be kept very small. To enable two-dimensional adjustments, both the mounting and the adjustment surfaces could be curved two-dimensionally. However, a curvature in one direction is sufficient for the adjustment of the line emitters described here.

Advantageously, the laser units are pivoted around one axis of the mounting unit for adjustment. In this case, the adjustment surface and the mounting surface are designed as cylinder segments. The radius is equal to the distance of the center of the axis to the mounting surface or adjustment surface, respectively. Supply and removal of the cooling fluid is carried out via two cooling channels that can be located at any desired place within the cylinder segment.

During the adjustment, the adjustment surface of the laser unit is pivoted around the axis relative to the mounting surface. Due to the shapes of the adjustment and mounting surfaces described above, a planar contact is established across the entire adjustment area between the mounting unit and the laser unit. Here too, the advantage of using O-rings as a seal between the cooling channels of the laser unit and the mounting unit is demonstrated. In this manner, the adjustment can be carried out during the operation of the laser module. Because the laser units are pressed by the axis in the direction of the mounting surface, the tightness of the O-rings is ensured here as well. Of course, fastening screws may also be provided that secure the laser units in their position after the adjustment and increase the contact pressure between adjustment and mounting surfaces even more.

A central inlet and outlet, respectively, are provided for the supply and removal of the cooling medium. Because the supply channels are connected to the central inlet, there are different pressure conditions in the central inlet from the supplying channels and it is possible that different amounts of cooling medium enter through the individual laser units. This leads to different cooling of the individual laser units. Different cooling in turn leads to different optical performances of the individual laser units. In an advantageous manner, the flow can be adjusted through each laser unit.

In a particularly advantageous manner, the flow setting of the cooling medium is carried out via an adjustable throttle. These throttles are located at the connection of the individual cooling channels to the central inlet. Each throttle is equipped with a nozzle pin that can be adjusted via a thread relative to a nozzle. This pin tightens or expands the cooling channel cross-section in the nozzle. This allows for a precise setting of the volume flow of the cooling medium through each individual laser unit.

Sensors are provided to check the settings. These sensors are connected to the mounting unit and are located after each laser unit viewed in the direction of the flow. This allows for checking and monitoring of the amount of cooling medium throughput per unit of time. In a particularly advantageous manner, this is a flow meter. A fixed installation of the flow meter has the added advantage that the amount of flow can be adjusted later if needed or can be set anew after replacing a laser unit.

In one advantageous embodiment of the invention, the laser module is designed such that an essentially uniform line-shaped radiation image can be generated. To this end, the individual laser units in the laser module are offset from each other such that the central points of the radiation images of the laser diodes of the one laser unit are arranged between the central points of the radiation images of the laser diodes of the other laser unit. This applies particularly when using identical laser units. However, it is also possible to assemble differing laser units. These differing laser units must be designed such that the offset of the radiation images of the laser diodes is created already by the arrangement of the laser bars in the respective laser units. In this case, the laser units can be assembled exactly above each other without an offset.

For a full understanding of the present invention, reference should now be made to the following detailed description of the preferred embodiments of the invention as illustrated in the accompanying drawing.

DESCRIPTION OF PREFERRED EMBODIMENT

Figure 1:
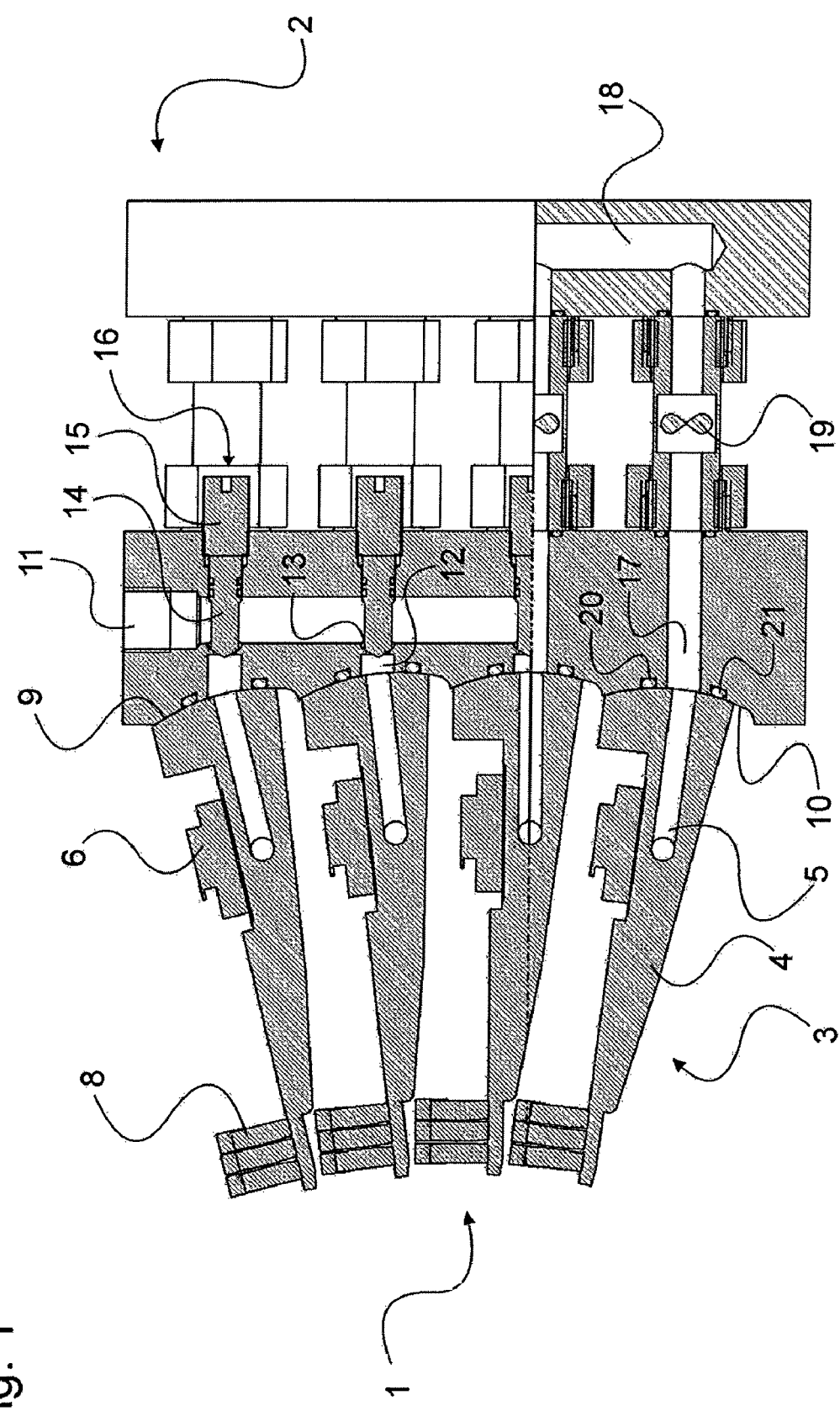
FIG. 1 shows a cross-section of the mounting unit of the assembled laser units.

The preferred embodiments of the present invention will now be described with reference to FIG. 1 of the drawing.

FIG. 1 shows a laser module 1 that exhibits a mounting unit 2 and four laser units 3 attached to it. The laser unit 3 shows a base body 4 cooling channels 5 running in it, a laser bar mounted on the base body 4 and a converging lens optics 8. At the side opposite the converging lens optics 8, the base body 4 exhibits a curved adjustment surface 9 that rests plainly on the curved mounting surface 10. The mounting surface 10 is a component of the mounting unit 2. The laser unit 3 pivots near the converging lens optics 8 on an axis (not shown here) and is secured in the area of the adjustment surface and mounting surface in a detachable manner using screws (not shown here).

Each curved adjustment 9 and mounting surface 10 is designed as a cylinder segment. The radius corresponds to the distance of the pivot axis to the adjustment 9 or mounting surface 10, respectively.

Located in the mounting unit 2 is a central inlet 11 for the cooling medium. Branching off from the cooling medium inlet 11 are four supply cooling channels 12 that lead to the individual mounting surfaces 10. The inlet of the supply cooling channel 12 is established by a nozzle 13 with a nozzle pin 14 extending into it. This nozzle pin 14 is permanently connected to an adjusting screw 15. The nozzle pin 14 and the adjusting screw 15 constitute the main components of a throttle 16.

A discharge cooling channel 17 is leading from each mounting surface 10 to a central cooling medium outlet 18. This central cooling medium outlet 18 is also a component of the mounting unit 2. The run of the discharge cooling channel 17 is interrupted by a flow meter 19.

In the mounting surfaces 10, a round groove 20 with a rectangular cross-section and an O-ring 21 placed in it are located around each opening of the supplying 12 and discharging cooling channels 17.

The laser diode bars 6 of the laser unit 2 emit light that is parallel-oriented by the collimator lens located directly ahead of it. Thereafter, the laser light passes through a converging lens optics 8 that shapes the laser light into a narrow line.

The heat generated by the laser diode bars 6 is transferred to the cooling medium that circulates in the cooling channels 5 of the base body 4. The cold cooling medium is fed to the central cooling medium inlet 11 of the mounting unit 2 and from there is distributed to the individual supply cooling channels 12. From there, the cooling medium that is still cold enters the cooling channels 5 of the base body 4. After taking up the lost heat of the laser diode bars 6, the warm cooling fluid flows through the discharging cooling channels 17 of the mounting unit 2 into the central cooling medium outlet 18.

Because the optical performance of the laser unit 3 depends on how much heat is dissipated, the volume flow of the cooling medium for each laser unit 3 is adjusted individually. To this end, the opening cross-section in the supplying cooling channel 12 between the nozzle pin 14 and the nozzle 13 is adjusted using an adjusting screw 15 such that the same amount of cooling medium flows per unit of time through each laser unit 3. To verify this, each discharging cooling channel 17 features a flow meter 19.

In an advantageous manner, sealing of the openings of the cooling channels 5 of the base body 4 that are located opposite each other, of the supplying 12 and discharging cooling channels 17 that conduct the cooling medium under pressure is provided by O-rings 21, which are located in a groove 20 of the mounting surface 10.

To adjust the laser module 1, securing means (not shown), e.g., screws are loosened and the laser units 2 are rotated around a pivoting axis until the beams of all laser units 3 converge on one line on the surface of the work piece. Because the curvature of the adjustment surface 9 and of the mounting surface 10 have the same shape, the distance between the mounting unit 2 and the laser unit 3 does not change during the pivoting motion. Because the laser units 3 must be operational for the adjustment and must already contain the cooling medium, the O-ring 21 seals reliably even during the pivoting motion such that no leakage of the cooling medium occurs in the area of the O-ring 21. The openings of the cooling channels 5 of the base body 4, of the supplying 12 and of the discharging cooling channels 17 are dimensioned such that the cross-section of the one opening fully covers the cross-section of the opening that is located opposite from it over the entire adjustment range. This prevents undesirable constrictions in the areas of the cooling channels. Otherwise, this could lead to an increase of the pressure on the O-rings 21 and could lead to leakage at the time of the adjustment. In an advantageous manner, the adjustment of the laser units is carried out prior to the adjustment of the flow amount of the cooling medium by the individual laser units 3.

The assembly of several laser units 3 on one mounting unit 2 leads to a very space-saving arrangement. Using O-rings 21 as seals replaces the otherwise necessary hoses or lines carrying the cooling medium. All this leads to a very compact and powerful laser module 1.

There has thus been shown and described a novel laser module which fulfills all the objects and advantages sought therefor. Many changes, modifications, variations and other uses and applications of the subject invention will, however, become apparent to those skilled in the art after considering this specification and the accompanying drawing which discloses the preferred embodiment thereof. All such changes, modifications, variations and other uses and applications which do not depart from the spirit and scope of the invention are deemed to be covered by the invention, which is to be limited only by the claims which follow.

What is claimed is:

1. A laser module comprising at least two laser units that are adjusted such that the emitted beams of the laser units converge, the laser units having cooling channels that are supplied with a cooling medium, the improvement comprising a mounting unit having at least one mounting surface, wherein at least one of said laser units has a curved adjustment surface which is mounted to the mounting unit such that a cooling channel opening in the adjustment surface is located opposite an additional cooling channel opening in the mounting surface.

2. A laser module as set forth in claim 1, further comprising a ring seal disposed on said at least one laser unit to provide sealing between the cooling channel opening in the adjustment surface and the cooling channel opening in the mounting surface.

3. A laser module as set forth in claim 2, wherein the ring seal is an O-ring.

4. A laser module as set forth in claim 1, wherein the cooling channel opening in the mounting surface exhibits a different cross-section than the cooling channel opening in the adjustment surface.

5. A laser module as set forth in claim 4, wherein the cross-section of one cooling channel opening is sufficiently large that it fully covers the cross-section opening of the other cooling channel opening across the entire adjustment range.

6. A laser module as set forth in claim 1, wherein the mounting surface exhibits the same curvature as the adjustment surface.

7. A laser module as set forth in claim 1, further comprising means for individually adjusting the flow of the cooling medium for each laser unit.

8. A laser module as set forth in claim 7, wherein the means for adjusting the flow of the cooling medium is a throttle valve.

9. A laser module as set forth in claim 7, further comprising a sensor for checking the flow of the cooling medium.

10. A laser module as set forth in claim 8, wherein the sensor is a flow meter.

11. A laser module as set forth in claim 1, wherein the at least two laser units have several adjacent laser bars with several laser diodes.

12. A laser module as set forth in claim 11, wherein the laser units are arranged such that the central points of the radiation images of the laser diodes of the one laser unit are arranged between the central points of the radiation images of the laser diodes of another laser unit.

* * * * *